United States Patent
Inoue

(10) Patent No.: US 6,964,905 B2
(45) Date of Patent: Nov. 15, 2005

(54) SEMICONDUCTOR DEVICE AND METHOD OF MANUFACTURING THEREFOR

(75) Inventor: Masao Inoue, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/095,053

(22) Filed: Mar. 12, 2002

(65) Prior Publication Data

US 2003/0011019 A1 Jan. 16, 2003

(30) Foreign Application Priority Data

Jul. 11, 2001 (JP) ........................................ 2001-211030

(51) Int. Cl.[7] .............................................. H01L 21/76
(52) U.S. Cl. ...................... 438/296; 438/424; 438/435; 438/437; 438/770
(58) Field of Search ................................. 438/296, 424, 438/435, 437, 770

(56) References Cited

U.S. PATENT DOCUMENTS

| | | | |
|---|---|---|---|
| 5,763,315 A | | 6/1998 | Benedict et al. |
| 5,780,346 A | * | 7/1998 | Arghavani et al. ........... 438/296 |
| 5,840,759 A | * | 11/1998 | Mitchell et al. ............. 514/610 |
| 6,037,273 A | | 3/2000 | Gronet et al. |
| 6,153,480 A | | 11/2000 | Arghavani et al. |
| 6,187,651 B1 | * | 2/2001 | Oh .............................. 438/435 |
| 6,326,282 B1 | * | 12/2001 | Park et al. ................... 438/424 |
| 2002/0003275 A1 | * | 1/2002 | Lee et al. .................... 257/510 |

FOREIGN PATENT DOCUMENTS

| | | | |
|---|---|---|---|
| JP | 5-275419 | | 10/1993 |
| JP | 8-255905 | * 10/1996 | ........... H01L/29/78 |
| JP | 10-12612 | 1/1998 | |
| JP | 10-313114 | * 11/1998 | ........... H01L/29/78 |
| JP | 11-340313 | 12/1999 | |
| JP | 2001-160589 A | 6/2001 | |

OTHER PUBLICATIONS

Stanley Wolf Silicon Processing for the VSLI era vol. 3 Lattice Press 1995 p. 334.*
Peter Van Zant Microchip Fabrication McGraw-Hill 2000 pp. 172-173.*
Peter Atkins et al Chemical Principles W. H Freeman and Company 1998 pp. 71-72.*
Stanley Wolf Silicon Processing for the VLSI era vol. 2 Lattice Press 1990 p. 634.*

* cited by examiner

Primary Examiner—David S. Blum
(74) Attorney, Agent, or Firm—McDermott Will & Emery LLP

(57) ABSTRACT

An active region on a semiconductor substrate is electrically isolated by trench isolation. A structure of the trench isolation is constituted of: a trench; a silicon oxide film formed on the inner wall of trench; an oxidation preventive film formed between silicon oxide film and semiconductor substrate; and a filling oxide film filling trench. Gate oxide film is formed by oxidation having a high capability by which radicals of at least one kind of hydrogen radicals and oxygen radicals are generated. Thereby, gate oxide film is formed so as to have a almost uniform thickness such that a thickness of a region directly above oxidation preventive film and a thickness of a region directly below gate electrode are almost the same is each other. According to the above procedure, there are obtained a semiconductor device having good transistor characteristics and a fabrication process therefor.

5 Claims, 11 Drawing Sheets

SEMICONDUCTOR DEVICE AND METHOD OF MANUFACTURING THEREFOR

BACKGROUND OF THE INVENTION

1. Field of the Invention

The present invention relates to a semiconductor device and a fabrication process therefor, and more particularly, to a semiconductor device forming an oxidation preventive film in a trench isolation structure therein and a fabrication process therefor.

2. Description of the Background Art

A stress is produced in the inner wall of a trench due to volume expansion of the inner wall of the trench, caused by oxidation in an oxidation process after formation of a trench isolation structure to thereby generate crystal defects such as dislocations and micro-defects in a silicon (Si) substrate. In order to prevent generation of the crystal defects, there has been available a technique forming an oxidation preventive film on the inner wall of the trench. Description will be given of a prior art technique forming the oxidation preventive film below.

FIGS. 18 to 24 are schematic sectional views showing a sequence of steps of a method of manufacturing a prior art semiconductor device. Referring to FIG. 18, for example, an insulating film 102 is formed on a p type silicon substrate 101.

Referring to FIG. 19, insulating film 102 is patterned by a photolithographic technique and an etching technique at the ordinary levels. By use of any convenient etching technique such as anisotropic dry etching with the patterned insulating film 102 as a mask, a trench 103 of a prescribed depth is formed on a surface of silicon substrate 101.

Referring to FIG. 20, in order to remove a damaged layer caused by the etching and furthermore, rounding the top edge portion of trench 103, a silicon oxide layer 104 is formed on the inner wall of trench 103.

Referring to FIG. 21, in order to prevent oxidation of the inner wall of trench 103 in a subsequent oxidation step, an oxidation preventive film 106 is formed. Oxidation preventive film 106 is formed as a silicon nitride film at the interface between silicon substrate 101 and silicon oxide film 104 by annealing silicon substrate 101 in an atmosphere including nitrogen (N).

Referring to FIG. 22, a filling oxide film 107 constituted of a silicon oxide film is formed on insulating film 102 so as to fill trench 103. Thereafter, by annealing silicon substrate 101 at a prescribed temperature in a prescribed atmosphere, filling oxide film 107 is densified. Thereafter, the surface of silicon substrate 101 is planarized by means of a CMP (Chemical Mechanical Polishing) method and subsequently, insulating film 102 on an active region is removed by wet etching.

Referring to FIG. 23, the CMP and the wet etching exposes the surface of silicon substrate 101 while leaving filling oxide film 107 so as to fill trench 103, thus completing a trench isolation structure.

Referring to FIG. 24, a gate oxide film 108 is formed on the surface of silicon substrate 101 by oxidation. The oxidation is effected by introducing hydrogen gas and oxygen gas into a reaction vessel accommodating wafers after the gases react with each other, or introducing only oxygen gas into the reaction vessel. Thereafter, a gate electrode is formed on gate oxide film 108 and subsequent to this, an impurity is ion implanted into silicon substrate 101 with the gate electrode or the like as a mask, thereby forming a pair of source/drain regions on the surface of silicon substrate 101. In such a way, there are formed a MOS (Metal Oxide Semiconductor) transistor used in DRAM (Dynamic Random Access Memory) and others, and a floating-gate transistor used in EEPROM (Electrically Erasable Programmable Read Only Memory) and others.

In the above semiconductor device, oxidation preventive film 106 is formed on the inner wall of a trench isolation structure. Therefore, a film thickness of gate oxide film 108 shows thinning as depicted in FIG. 25 at the top edge portion of the trench isolation structure (on the oxidation preventive film 106). That is, a film thickness TA3 of gate oxide film 108 at the top edge portion of the trench isolation structure is thinner than those of the other parts, having resulted in a problem of difficulty in forming a high reliability gate oxide film 108.

SUMMARY OF THE INVENTION

It is an object of the present invention to provide a semiconductor device capable of suppressing thinning of a gate oxide film at the top edge portion of a trench isolation structure therein and a method of manufacturing therefor.

A method of manufacturing a semiconductor device of the present invention includes the following steps.

First of all, a trench is formed on a main surface of a semiconductor substrate. Then, an oxidation preventive film is formed along the inner wall of the trench. A filling layer is formed so as to fill the trench. A high oxidation capability is applied on the main surface of a semiconductor substrate in an atmosphere in which radicals of at least one kind of hydrogen radicals and oxygen radicals are generated to thereby form a gate oxide film on the main surface of a semiconductor substrate.

In a method of manufacturing a semiconductor device of the present invention, since an oxidation with a high capability is applied by which radicals of at least one kind of hydrogen radicals and oxygen radicals are generated, oxidation speeds of the semiconductor substrate and the oxidation preventive film can be almost the same as that of each other. Therefore, a thickness of a gate oxide film, formed by this oxidation, directly above the oxidation preventive film at the top edge portion of the step in the trench can be of the same order as those of the gate oxide film in the other regions. With this, the film thickness of the gate oxide film can be uniform to thereby obtain a high reliability gate oxide film.

The above method of manufacturing a semiconductor device preferably further includes: a step of forming a gate electrode on the gate oxide film; and a step of forming a pair of source/drain regions on the main surface of a semiconductor substrate so as to sandwich a region directly below the gate electrode between the source/drain regions.

With such steps added, a transistor with a gate layer can be formed.

In the above method of manufacturing a semiconductor device, the gate electrode is preferably formed so as to have a floating gate and a control gate, insulated from each other.

Thereby, a memory cell of a flash memory can be fabricated.

In the above method of manufacturing a semiconductor device, the gate oxide film preferably has almost the same thickness in a region directly above the oxidation preventive film and a region directly below the gate electrode.

In such a way, the gate oxide film having a uniform thickness can be formed.

In the above method of manufacturing a semiconductor device, the oxidation preventive film is preferably made from at least one of a silicon nitride film and a silicon oxynitride film.

In such a way, various kinds of films can be chosen as an oxidation 110 preventive film.

A semiconductor device of the present invention includes: a semiconductor substrate; an oxidation preventive film; a filling layer; a gate oxide film; and a gate electrode. The semiconductor substrate has a trench on a main surface of the semiconductor substrate. The oxidation preventive film is formed along the inner wall of the trench. The filling layer fills the trench. The gate oxide film is formed on the main surface of the semiconductor substrate and the oxidation preventive film. The gate electrode is formed on the gate oxide film. The gate oxide film has almost the same thickness in a region directly above the oxidation preventive film and a region directly below the gate electrode.

In a semiconductor device of the present invention, since the gate oxide film has almost the same thickness in a region directly above the oxidation preventive film and a region directly below the gate electrode, a thickness of the gate oxide film can be uniform. Thereby, a high reliability gate oxide film can be obtained.

In the above semiconductor device, the gate electrode preferably has a floating gate electrode and a control gate, insulated from each other.

Thereby, a memory cell of a flash memory can be fabricated.

In the above semiconductor device, the oxidation preventive film is preferably made from at least one of a silicon nitride film and a silicon oxynitride film.

In such a way, various kinds of films can be selected as an oxidation preventive film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Description will be given of embodiments of the present invention below on the basis of the accompanying drawings.
(First Embodiment)

Figure 1:
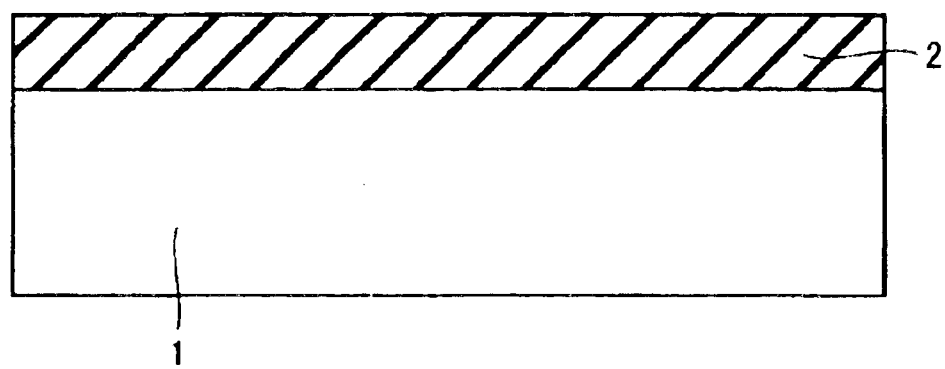
FIGS. 1 to 7 are schematic sectional views showing a sequence of steps of a method of manufacturing a semiconductor device in a first embodiment of the present invention.

First of all, referring to FIG. 1, an insulating film 2 is formed on a semiconductor substrate 1 made of silicon of a p conductivity type, for example.

Figure 2:
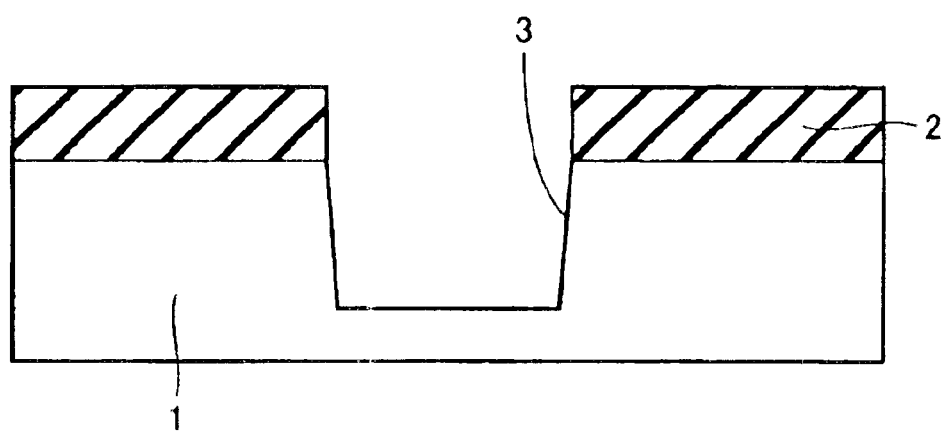

Referring to FIG. 2, insulating film 2 is patterned by a photolithographic technique and an etching technique at the ordinary levels. By use of any convenient etching technique such as anisotropic dry etching with patterned insulating film 2 as a mask, a trench 3 of a desired depth is formed on a surface of semiconductor substrate 1.

Figure 3:
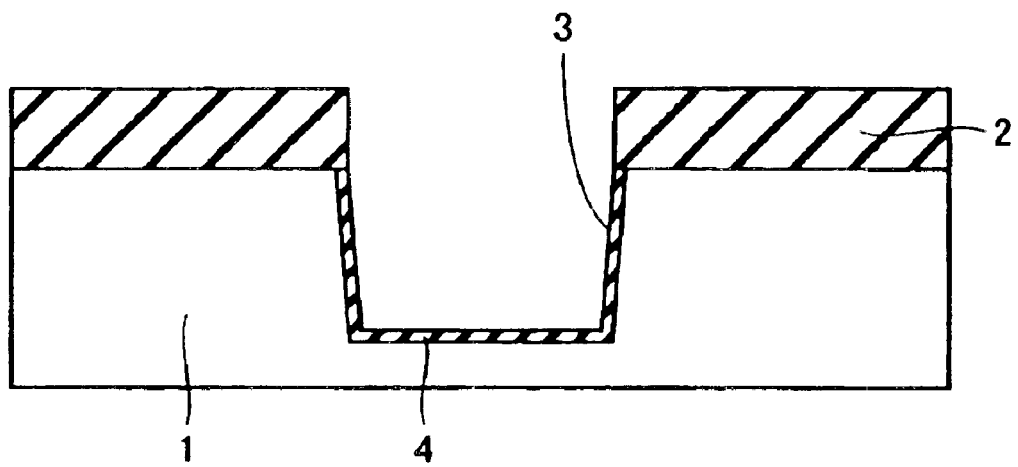

Referring to FIG. 3, in order to remove a damaged layer caused by the etching and further, round the top edge portion of trench 3, thermal oxidation is applied onto semiconductor substrate 1. By doing so, a silicon oxide film 4 is formed on the inner wall of trench 3 to a thickness of from 10 nm to 70 nm.

Figure 4:
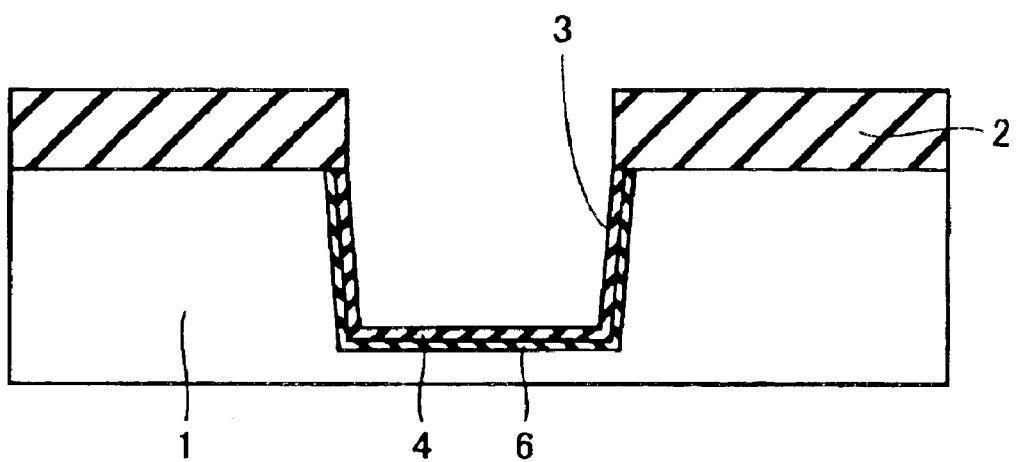

Referring to FIG. 4, in order to prevent oxidation of the inner wall of trench 3 that would be caused by a subsequent oxidation step, annealing is applied to semiconductor substrate 1 in an atmosphere including at least one of NO gas, $N_2O$ gas and $NH_3$ gas at a temperature in the range of from 850° C. to 1000° C. With such annealing, an oxidation preventive film 6 made of a silicon nitride film is formed at the interface between semiconductor substrate 1 and silicon oxide film 4.

Figure 5:
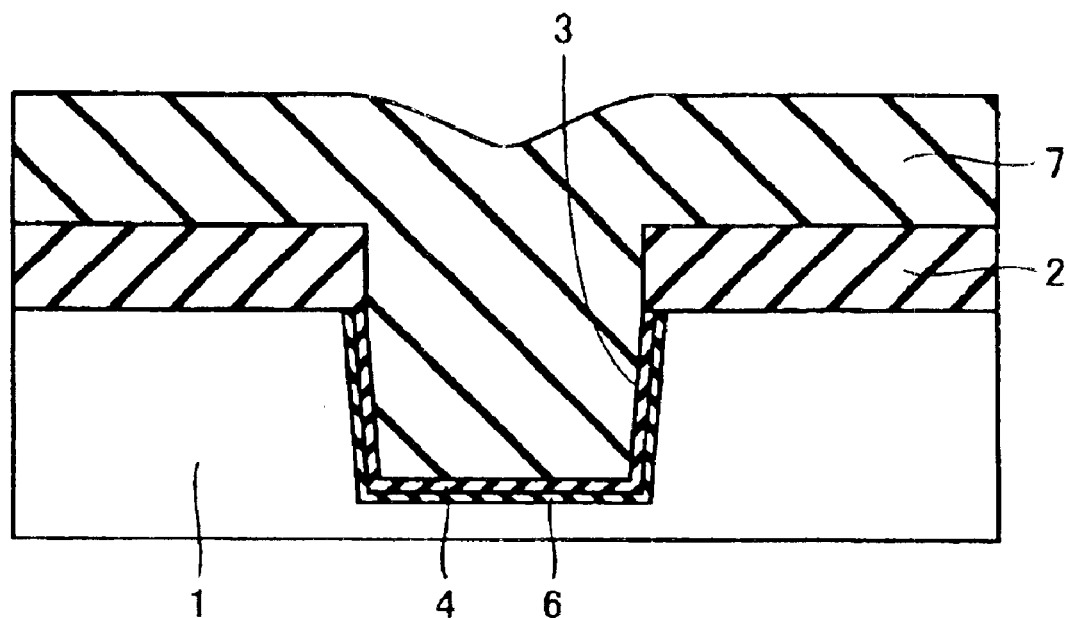

Referring to FIG. 5, a silicon oxide film such as a TEOS (Tetra Ethyl Ortho Silicate) oxide film, a HDP (High Density Plasma) oxide film or the like is formed on insulating film 2 so as to fill the interior of trench 3 by means of a LPCVD (Low Pressure Chemical Vapor Deposition) method. Thereafter, annealing is performed on semiconductor substrate 1 at 800° C. to 1150° C. in a $N_2$ (nitrogen) atmosphere for densification of a filling oxide film 7. After filling oxide film 7 is removed by CMP to planarize the surface of semiconductor substrate 1, insulating film 2 on an active region is removed by wet etching.

Figure 6:
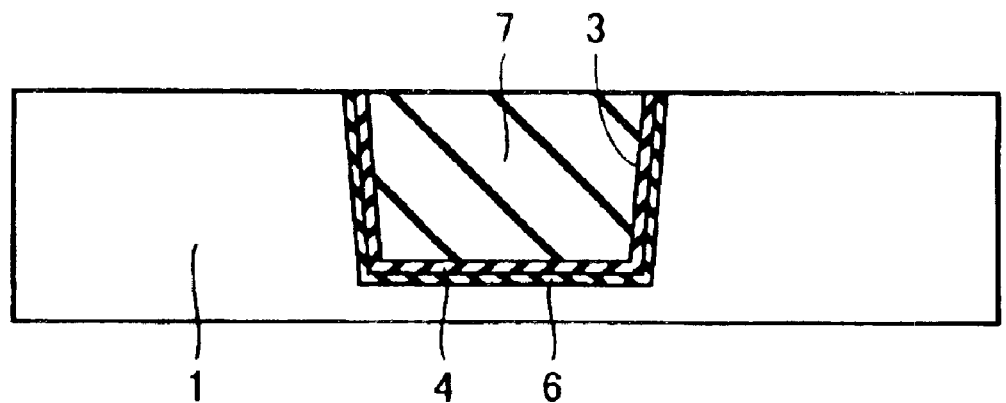

Referring to FIG. 6, the surface of semiconductor substrate 1 is exposed by the above CMP and the wet etching to leave filling oxide film 7 only in trench 3 and complete trench isolation.

Figure 7:
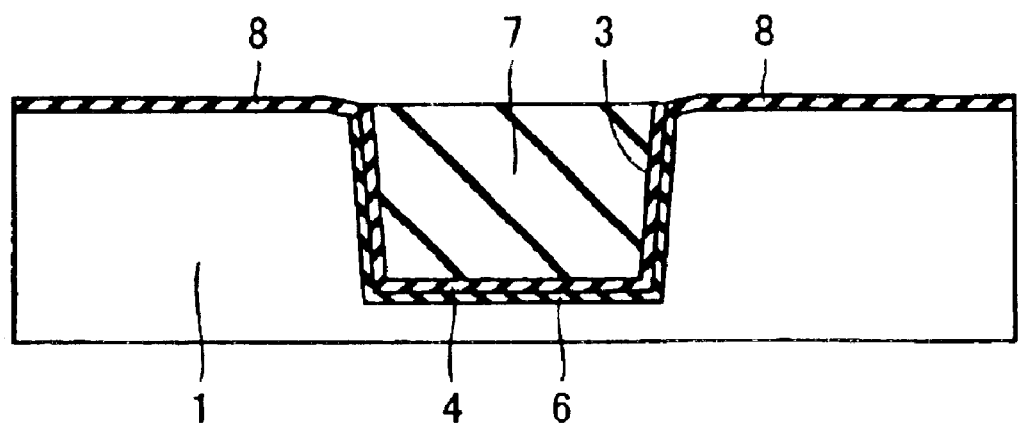

Referring to FIG. 7, a gate oxide film 8 is formed on the active region of semiconductor substrate 1. Gate oxide film 8 is formed under a so-called steam condition, that is under an oxidative condition in which hydrogen radials and oxygen radicals are generated, and having so high an oxidative capability that oxidation preventive film 6 such as a silicon nitride film can be oxidized. To be concrete, hydrogen gas and oxygen gas are separately introduced into a reaction vessel accommodating wafers to react with each other directly above the wafers and thereby generate hydrogen radicals and oxygen radicals, which generates oxidation with a high capability. In such a manner, there are formed a trench isolation structure and gate oxide film 8 in the embodiment.

Figure 8:
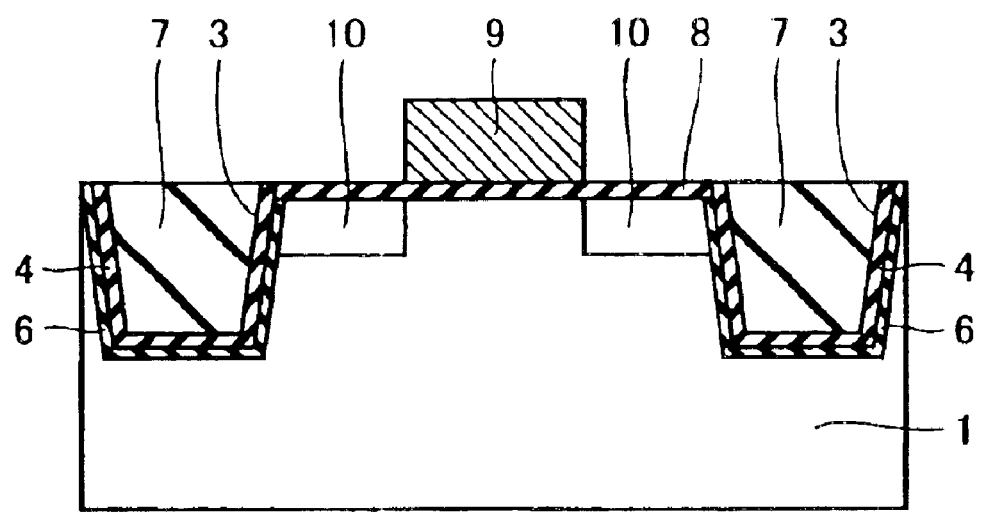
FIG. 8 is a schematic sectional view showing a structure of a MOS transistor formed after a gate oxide film of the semiconductor device in the first embodiment of the present invention is formed.

Gate oxide film 8 thus formed can be used as a gate insulating film of an ordinary MOS transistor as shown in FIG. 8, for example. Such a MOS transistor is formed in a way described below after the step of FIG. 7.

Referring to FIG. 8, a conductive layer used in a gate electrode is formed on gate oxide film 8 and thereafter, patterned by a photolithographic technique and an etching technique at the ordinary levels to form a gate electrode 9. An n type impurity such as arsenic or phosphorus is ion implanted in an active region of semiconductor substrate 1 with gate electrode 9 as a mask. With the ion implantation applied, a pair of source/drain regions 10 are formed on the surface of semiconductor substrate 1 so as to sandwich a region directly below gate electrode 9 between source/drain regions 10 to thereby complete a MOS transistor.

Then, description will be given of a structure of the semiconductor device fabricated as described above.

Referring to FIG. 8, the active region of semiconductor substrate 1 is electrically isolated by trench isolation. The trench isolation structure is constituted of: silicon oxide film 4 formed along the inner wall of trench 3 provided on semiconductor substrate 1; oxidation preventive film 6 made of a silicon nitride film or the like formed at the interface between silicon oxide film 4 and semiconductor substrate 1; and filling oxide film 7 filling trench 3.

A MOS transistor is formed in the active region electrically isolated. The MOS transistor has: gate oxide film 8; gate electrode 9: and pair of source/drain regions 10. Gate oxide film 8 is formed on the active region of semiconductor substrate 1 and gate electrode 9 obtained by patterning is formed on gate oxide film 8. Pair of source/drain regions 10 is formed on the surface of semiconductor substrate 1 so as to sandwich the region directly below gate electrode 9 between source/drain regions 10.

Figure 9:
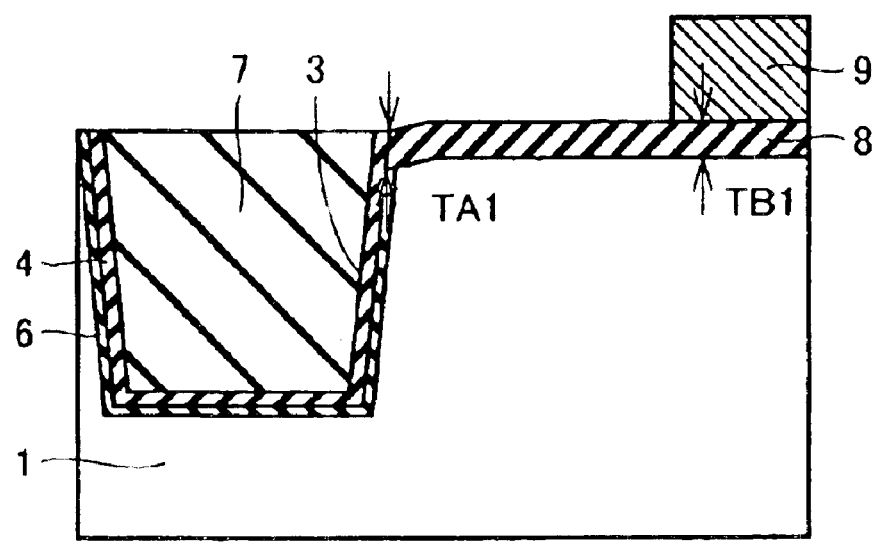
FIG. 9 is a schematic sectional view for describing a film thickness of the gate oxide film of the semiconductor device of the first embodiment of the present invention.

Gate oxide film 8 described above has a uniform thickness such that a thickness TA1 of a region directly above oxidation preventive film 6 and a thickness TB1 of a region directly below gate electrode 9 are equal to each other as shown in FIG. 9.

In the embodiment, an oxidizing method is applied, in which hydrogen radicals and oxygen radicals are generated, and which has so high an oxidative capability that oxidation preventive film 6 made of a silicon nitride or the like can be oxidized, thereby forming gate oxide film 8. For this reason, in the oxidation, oxidizing speeds on oxidation preventive film 6 made of a silicon nitride and semiconductor substrate 1 made of silicon can be the same as each other. Thereby, gate oxide film 8 as shown in FIG. 9 comes to have almost the same thickness in a region directly above oxidation preventive film 6 and in a region directly below gate electrode 9, thereby enabling prevention of thinning of gate oxide film 8 at the top edge portion of the trench isolation structure.

Since gate oxide film 8 has a uniform thickness in such a way, gate oxide film 8 has difficulty in deterioration and increases a breakdown lifetime, thereby enabling a high reliability gate oxide film 8 to be achieved. Therefore, a device having good transistor characteristics can be obtained that is categorized in DRAM (Dynamic Random Access Memory) or the like.

Not that after the step shown in FIG. 7, a floating gate transistor shown in FIG. 10 can also be formed, which will be described below.

Figure 10:
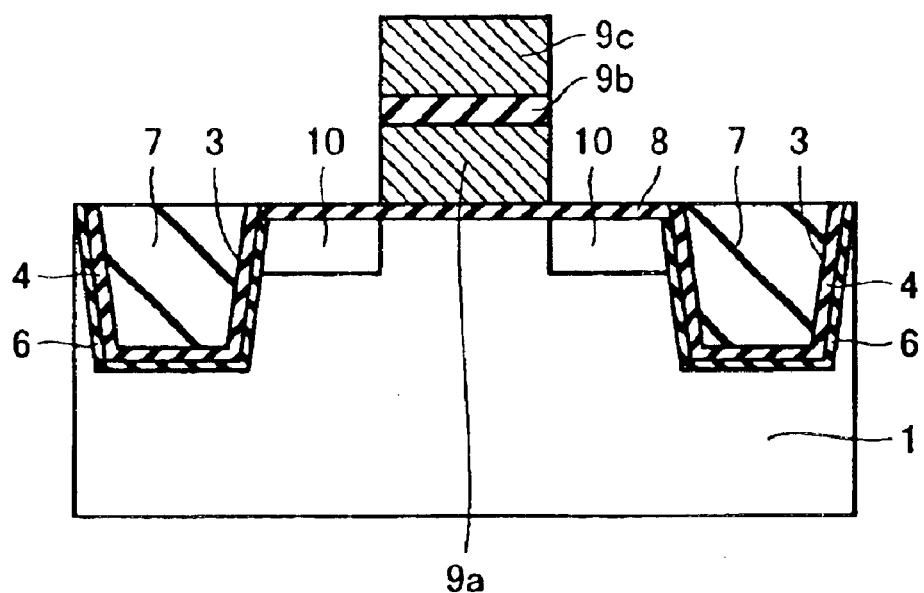
FIG. 10 is a schematic sectional view showing indispensable features combined of the first embodiment of the present invention, which is applied to a floating gate transistor.
Figure 11:
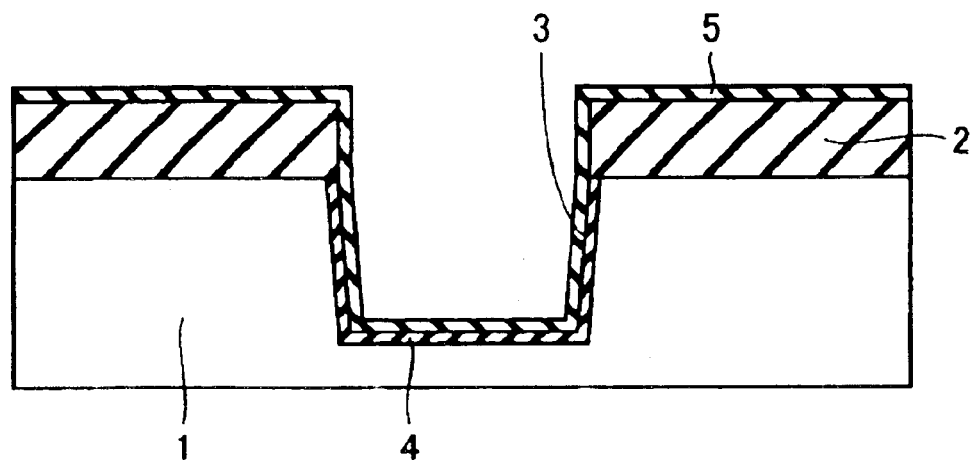
FIGS. 11 to 14 are schematic sectional views showing a sequence of steps of a method of manufacturing a semiconductor device in a second embodiment of the present invention.

Referring to FIG. 10, after a floating electrode 9*a* is formed on gate oxide film 8, an insulating film 9*b* and a control gate electrode 9*c* are formed on floating gate electrode 9*a*. An n type impurity such as arsenic or phosphorus is ion implanted with control gate electrode 9*c* or the like as a mask. By doing so, pair of source/drain regions 10 is formed on the surface of semiconductor substrate 1 to thereby complete the floating gate transistor.

The floating gate transistor thus fabricated has floating gate electrode 9*a* and control gate electrode 9*c*, insulated from each other. Since a structure of the floating gate transistor is almost the same as that of the above ordinary MOS transistor of FIG. 8, the same symbols are attached to the same constituents and description thereof is omitted.

In the above floating gate transistor, too, by preventing thinning of gate oxide film 8 at the top edge portion of the trench isolation structure, gate oxide film 8 having a uniform thickness can be obtained. By doing so, gate oxide film 8 has difficulty in deterioration and a long breakdown lifetime, thereby enabling a flash memory having good transistor characteristics to be obtained.

(Second Embodiment)

A fabrication process of the embodiment is different from that of the first embodiment by comparison in a step of forming an oxidation preventive film. A fabrication process of the embodiment follows a sequence of steps similar to that of the first embodiment shown in FIGS. 1 to 3. Thereafter, there is formed an oxidation preventive film 5 constituted of a silicon nitride film (an SiN film) and a silicon oxynitride (an SiON film) to a thickness from 5 nm to 30 nm.

Figure 12:
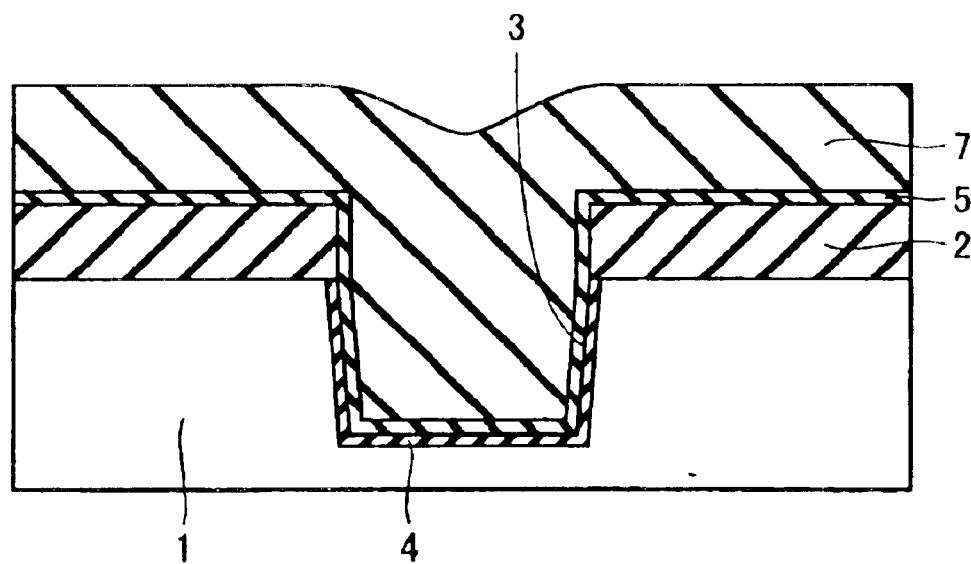

Referring to FIG. 12, a filling oxide film 7 is formed in a similar way to that of the first embodiment 1 so as to fill trench 3. Thereafter, the surface of silicon substrate 1 is planarized by CMP, followed by removal of insulating film 2 on the active region with wet etching.

Figure 13:
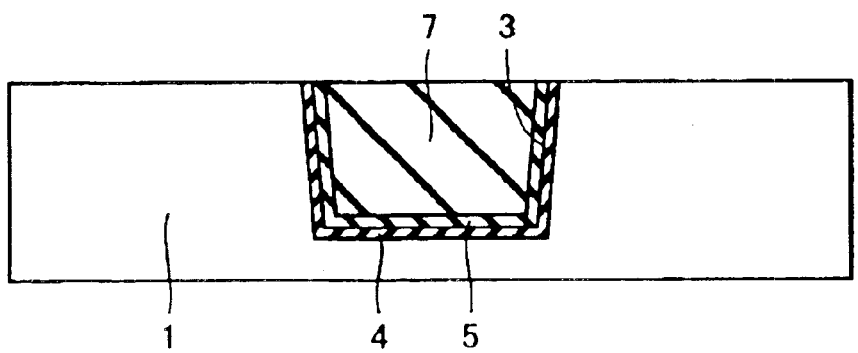

Referring to FIG. 13, by removal of insulating film 2, the surface of semiconductor substrate 1 is exposed, leaving filling oxide film 7 in trench 3 only, to complete trench isolation.

Figure 14:
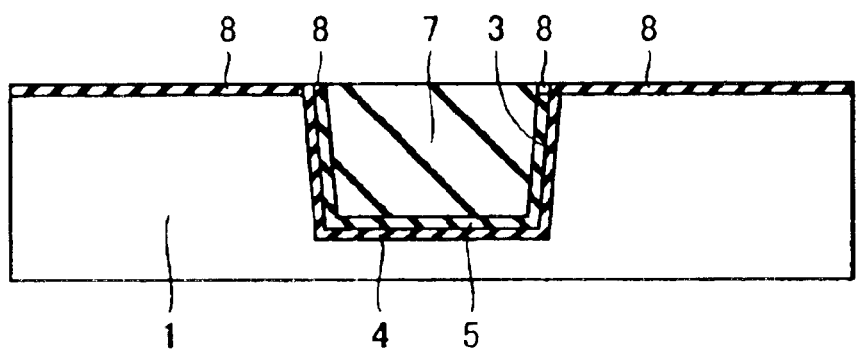

Referring to FIG. 14, an gate oxide film 8 is formed in conditions similar to those of the first embodiment. In formation of gate oxide film 8, an oxidation method with a high capability is employed; therefore, oxidation preventive film 5 is also oxidized to form gate oxide film 8 in a region directly above oxidation preventive film 5. In such a way, the trench isolation structure and gate oxide film 8 in the embodiment are formed.

Figure 15:
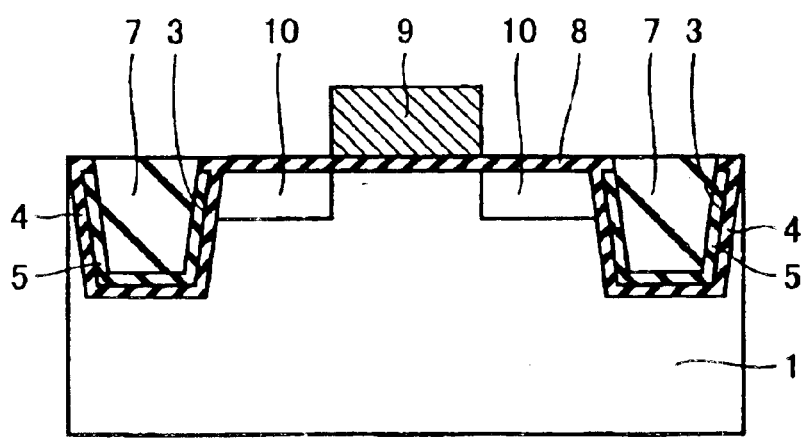
FIG. 15 is a schematic sectional view showing a structure of a MOS transistor formed after a gate oxide film of the semiconductor device in the second embodiment of the present invention is formed.

Gate oxide film 8 thus formed can be used as a gate insulating film of an ordinary MOS transistor as shown in FIG. 15, for example. Such a MOS transistor is formed after the step of FIG. 14, similar to the first embodiment.

Then, description will be given of a structure of the semiconductor device fabricated as described above.

Referring to FIG. 15, the active region of semiconductor substrate 1 is electrically isolated by trench isolation. The trench isolation structure is constituted of: silicon oxide film 4 formed along the inner wall of trench 3 formed on semiconductor substrate 1; oxidation preventive film 5 formed along the inner wall of silicon oxide film 4; and filling oxide film 7 filling trench 3.

A MOS transistor is formed in the active region electrically isolated by the trench isolation. The MOS transistor has: gate oxide film 8; gate electrode 9; and pair of source/drain regions 10. Gate oxide film 8 is formed on the active region of semiconductor substrate 1 and gate electrode 9 obtained by patterning is formed on gate oxide film 8. Pair of source/drain regions 10 are formed on the surface of semiconductor substrate 1 so as to sandwich a region directly below gate electrode 9 between source/drain regions 10.

Figure 16:
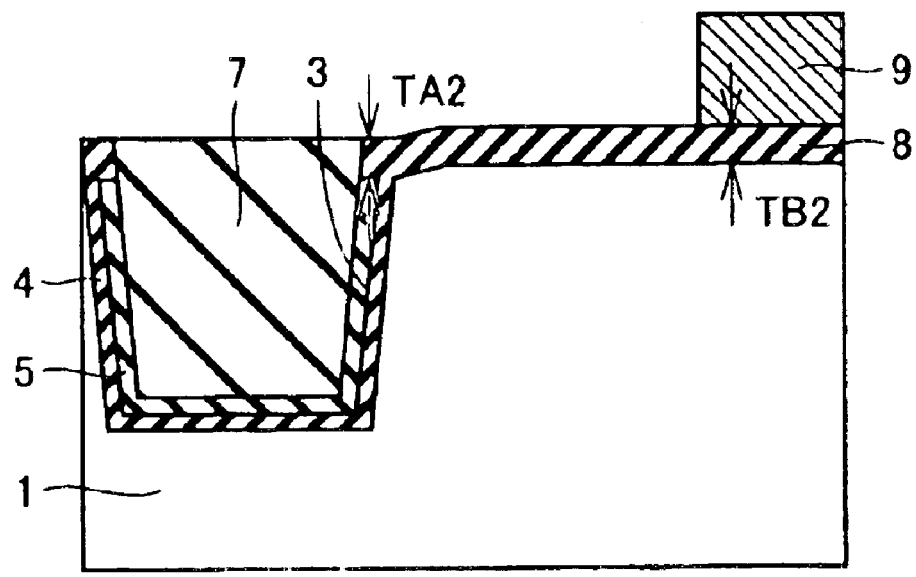
FIG. 16 is a schematic sectional view for describing a film thickness of the gate oxide film of the semiconductor device of the second embodiment of the present invention.

Gate oxide film 8 described above has a uniform thickness such that a thickness TA2 of a region directly above oxidation preventive film 5 and a thickness TB2 of a region directly below gate electrode 9 are equal to each other as shown in FIG. 16.

In the embodiment as well, similar to the first embodiment, thinning of gate oxide film 8 at the top edge portion of the trench isolation structure can be prevented from being produced and gate oxide film 8 has a uniform film thickness. For this reason, gate oxide film 8 has difficulty in deterioration and increases a breakdown lifetime, thereby enabling a high reliability gate oxide film 8 to be attained. Therefore, a device having good transistor characteristics can be obtained that is categorized in DRAM or the like.

Figure 17:
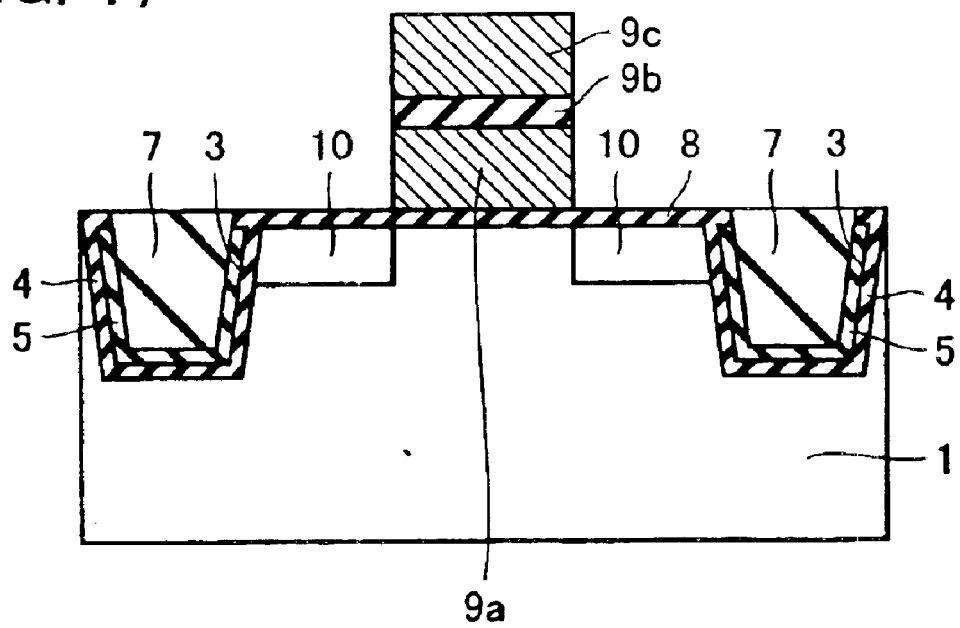
FIG. 17 is a schematic sectional view showing indispensable features combined of the second embodiment of the present invention, which is applied to a floating gate transistor.
Figure 18:
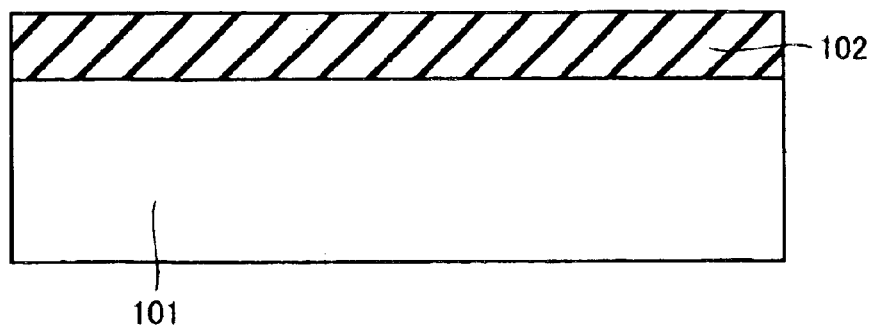
FIGS. 18 to 24 are schematic sectional views showing a sequence of steps of a method of manufacturing a prior art semiconductor device.
Figure 19:
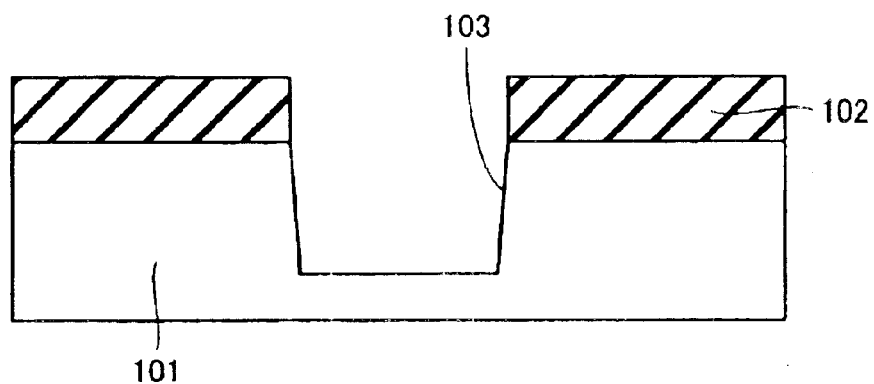
Figure 20:
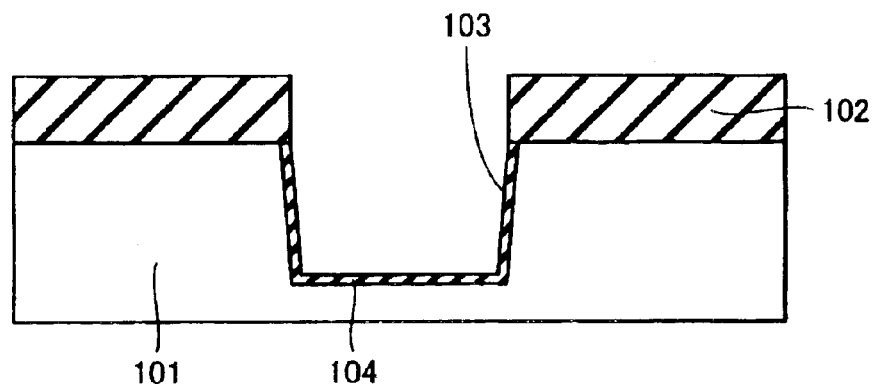
Figure 21:
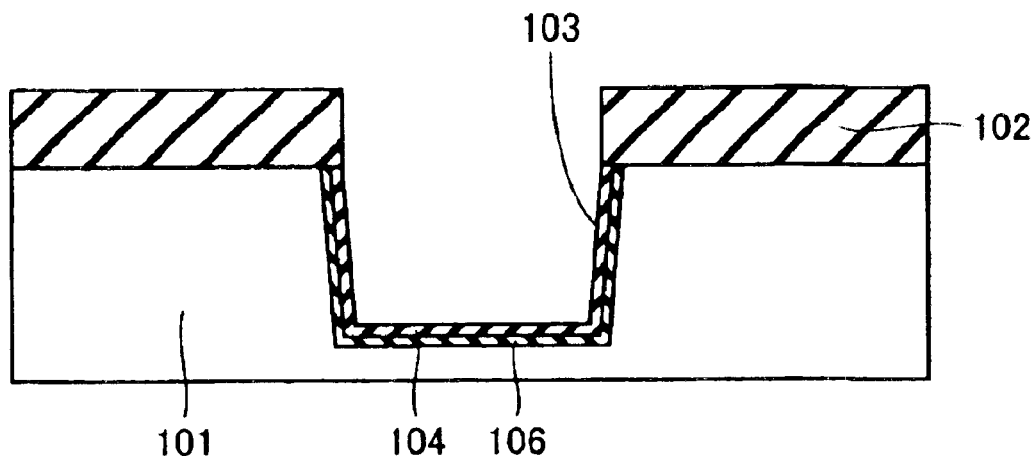
Figure 22:
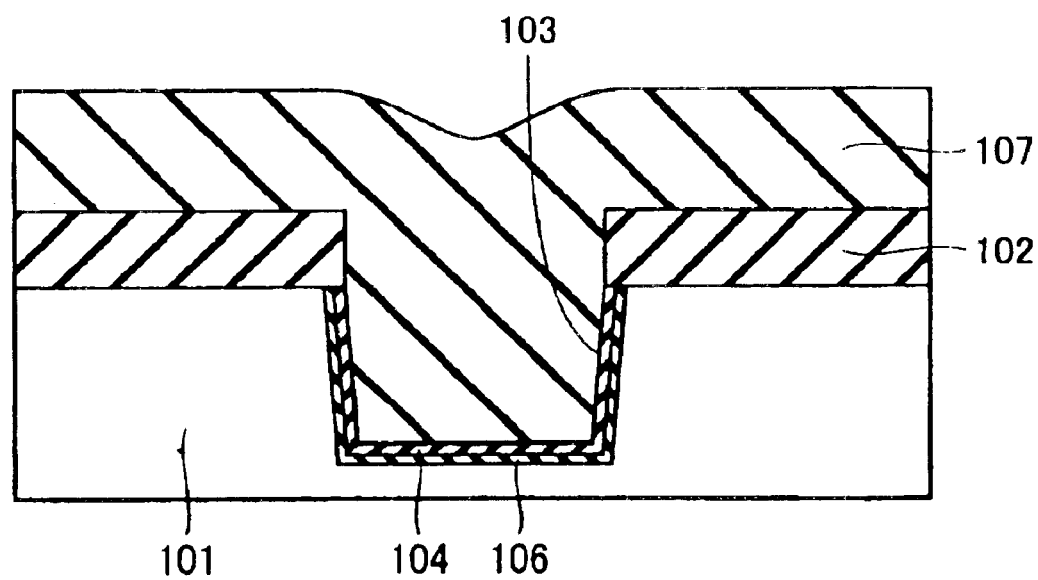
Figure 23:
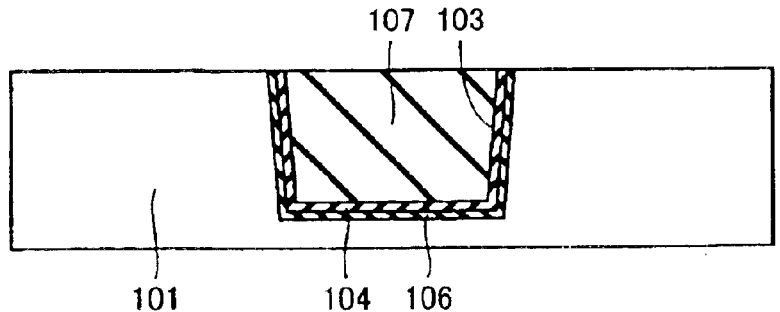
Figure 24:
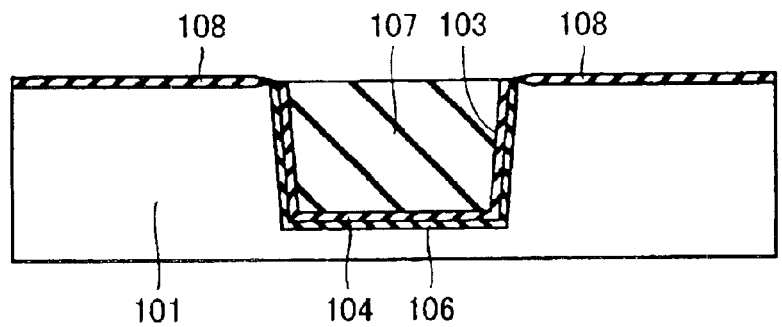
Figure 25:
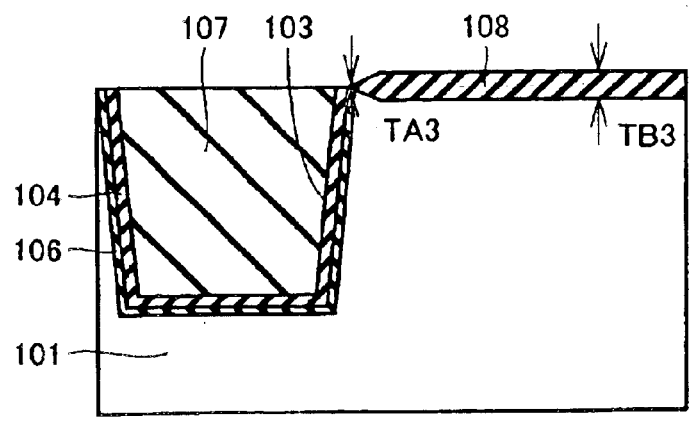
FIG. 25 is a schematic sectional view for describing a film thickness of a gate oxide film of the prior art semiconductor device.

Furthermore, while in FIG. 15, description is given of a structure of an ordinary MOS transistor, a fabrication process and structure of the embodiment, as shown in FIG. 17, can be applied to a floating gate transistor as well. In this case, gate oxide film 8 has difficulty in deterioration and a long breakdown life time, thereby enabling a flash memory with good transistor characteristics to be obtained.

Note that conductivity types associated with constituents of the above semiconductor device may be all inverted in polarity.

Furthermore, conditions for oxidation with a high capability in gate oxide film formation are not limited to the above conditions, but any condition may be adopted as far as an oxidation preventive film such as a silicon nitride film can be oxidized at almost the same speed as is silicon.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device comprising:

a step of forming a trench at a main surface of a semiconductor substrate;

the step of forming an oxidation preventive film along an inner wall of said trench;

the step of forming a filling layer so as to fill said trench; and the step of applying an high oxidation capability on said main surface of a semiconductor substrate in an atmosphere in which radicals of at least one kind of hydrogen radicals and oxygen radicals are generated to thereby form a gate oxide film on said main surface of a semiconductor substrate and to oxidize an upper surface of the oxidation preventive film such that oxidizing speeds on the oxidation preventive film and the semiconductor substrate are substantially the same as each other.

2. The method of manufacturing a semiconductor device according to claim 1, further comprising: a step of forming a gate electrode on said gate oxide film; and a step of forming a pair of source/drain regions in said main surface of a semiconductor substrate so as to sandwich a region directly below said gate electrode between said source/drain regions.

3. The method of manufacturing a semiconductor device according to claim 2, wherein said gate electrode is formed so as to have a floating gate and a control gate, insulated from each other.

4. The method of manufacturing a semiconductor device according to claim 2, wherein said gate oxide film has almost the same thickness in a region directly above said oxidation preventive film and a region directly below said gate electrode.

5. The method of manufacturing a semiconductor device according to claim 1, wherein said oxidation preventive film is made from at least one of a silicon nitride film and a silicon oxynitride film.

* * * * *